(12) United States Patent
Grover

(10) Patent No.: US 7,498,864 B2
(45) Date of Patent: Mar. 3, 2009

(54) ELECTRONIC FUSE FOR OVERCURRENT PROTECTION

(75) Inventor: Douglas R. Grover, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 283 days.

(21) Appl. No.: 11/397,747

(22) Filed: Apr. 4, 2006

(65) Prior Publication Data

US 2007/0229141 A1 Oct. 4, 2007

(51) Int. Cl.
*H03K 17/687* (2006.01)
(52) U.S. Cl. .................. 327/525; 365/225.7
(58) Field of Classification Search ........... 327/525, 327/526
See application file for complete search history.

(56) References Cited

U.S. PATENT DOCUMENTS

| | | | | |
|---|---|---|---|---|
| 3,646,364 A | * | 2/1972 | Kaminski | 327/389 |
| 4,896,245 A | * | 1/1990 | Qualich | 361/103 |
| 5,406,212 A | * | 4/1995 | Hashinaga et al. | 324/760 |
| 5,959,464 A | * | 9/1999 | Qualich | 324/769 |
| 6,411,116 B1 | * | 6/2002 | DeHaven et al. | 324/765 |
| 6,462,434 B1 | * | 10/2002 | Winick et al. | 307/85 |
| 6,476,589 B2 | * | 11/2002 | Umminger et al. | 323/282 |
| 6,850,083 B2 | | 2/2005 | Leshnovolsky et al. | |
| 6,900,650 B1 | * | 5/2005 | Sheng et al. | 324/760 |
| 2005/0135034 A1 | | 6/2005 | Johnson et al. | |
| 2005/0237689 A1 | * | 10/2005 | Maier | 361/103 |
| 2006/0136165 A1 | * | 6/2006 | Schuttert et al. | 702/120 |
| 2007/0081371 A1 | * | 4/2007 | Wittenbreder | 363/127 |

FOREIGN PATENT DOCUMENTS

WO  WO 2004/068156  * 8/2004

* cited by examiner

*Primary Examiner*—Lincoln Donovan
*Assistant Examiner*—Thomas J Hiltunen

(57) ABSTRACT

Current is provided from a first node coupled to an output of a power supply to a second node coupled to a voltage supply input of an electronic device under test via a transistor having a first current-carrying electrode coupled to the first node and a second current-carrying electrode coupled to the second node. A first voltage is determined based on a voltage difference between the first node and the second node and a second voltage is determined based on a comparison of the first voltage to a voltage of the second node. The transistor is selectively disabled based on the second voltage.

17 Claims, 4 Drawing Sheets

US 7,498,864 B2

ELECTRONIC FUSE FOR OVERCURRENT PROTECTION

FIELD OF THE DISCLOSURE

The present disclosure relates generally to burn-in testing of electronic devices and more particularly to providing overcurrent protection during burn-in testing.

BACKGROUND

Electronic device manufacturers frequently utilize burn-in testing for quality-assurance purposes. Burn-in testing typically entails positioning a device under test (DUT) in a corresponding socket of a test board and then subjecting the DUT to voltages and temperatures in excess of the expected normal operating conditions for extended periods of time. However, without overcurrent protection, the DUT can sink an excessive amount of current, which causes the DUT to melt in the test socket, rendering the socket unusable.

A conventional technique for supplying overcurrent protection is to position a metal fuse between the power supply and the voltage supply input of the DUT. However, the use of metal fuses often introduces additional problems. For one, an operator typically has to manually check each fuse to determine whether it has been blown, thereby incurring significant effort in verifying correct operation of the test board. Another problem with the use of a metal fuse is that it typically incurs a relatively large voltage drop across the fuse terminals during operation, thereby extending the amount of time for the burn-in process due to the reduced voltage applied to the DUT. Further, metal fuses typically are relatively slow to blow during an overcurrent condition. This relatively slow fuse blow time can result in damage to both the DUT and the test socket in the event of an overcurrent condition. Accordingly, an improved technique for overcurrent protection for a DUT would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
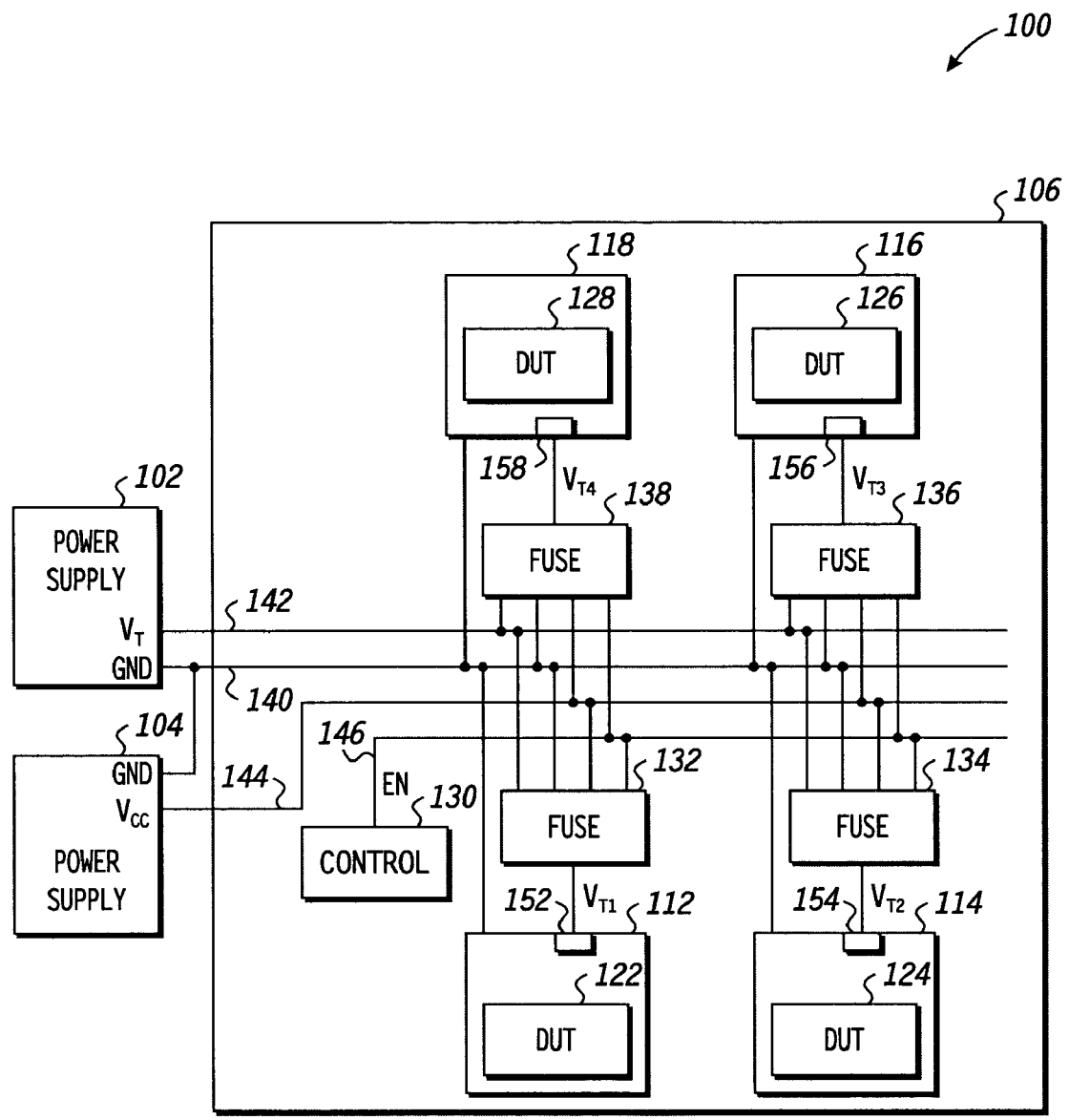
FIG. 1 is a block diagram illustrating an exemplary test board employing electronic fuse component in accordance with at least one embodiment of the present disclosure.

In accordance with one aspect of the present disclosure, an electronic device comprises a first transistor having a first current-carrying electrode coupled to a first node, a second current-carrying electrode coupled to a second node, and a control electrode. The first node is coupled to a voltage output of a power supply and the second node is coupled to a voltage supply input of an electronic device under test. The electronic device further includes a differential circuit having a first input coupled to the first node, a second input coupled to the second node, and an output to provide a first voltage based on a voltage difference between the first node and the second node. The electronic device also includes a comparator circuit having a first input coupled to the output of the differential circuit, a second input coupled to the second node, and an output to provide a second voltage based on a comparison of a voltage at the second node and the first voltage. The electronic device also includes switch circuitry having a first input coupled to the output of the comparator circuit and an output coupled to the control electrode of the first transistor, the output to provide a third voltage responsive to the second voltage.

In accordance with another aspect of the present disclosure, a method includes providing current from a first node coupled to an output of a power supply to a second node coupled to a voltage supply input of an electronic device under test via a transistor having a first current-carrying electrode coupled to the first node and a second current-carrying electrode coupled to the second node. The method further includes determining a first voltage based on a voltage difference between the first node and the second node, and determining a second voltage based on a comparison of the first voltage to a voltage of the second node. The method additionally includes selectively disabling the transistor based on the second voltage.

In accordance with yet another aspect of the present disclosure, a system includes a first power supply having an output to provide a first voltage, a second power supply having an output to provide a second voltage, and a test board having a plurality of sockets, each socket to receive a corresponding electronic device. The system further includes a plurality of fuse components. Each fuse component is associated with a corresponding one of the plurality of sockets and includes a first transistor having a first current-carrying electrode coupled to the output of the first power supply, a second current-carrying electrode coupled to a voltage supply input of the corresponding electronic device, and a control electrode. Each fuse component further includes current detection circuitry to provide a third voltage based on a voltage difference between the first current-carrying electrode and the second current-carrying electrode, and switch circuitry having a first input to receive an enable signal, a second input coupled to the output of the current detection circuitry, and an output coupled to the control electrode of the first transistor. The switch circuitry is configured to selectively disable current flow between the first current-carrying electrode and the second current-carrying electrode of the first transistor via the control electrode in response to at least one of the third voltage or the enable signal.

FIGS. 1-7 illustrate exemplary techniques for providing adaptive overcurrent protection for a device under test (DUT). In one embodiment, an electronic fuse component is used to connect a test power supply to a voltage supply input of a DUT. The electronic fuse component utilizes a transistor connected in series between the test power supply and the voltage supply input. A differential circuit of the electronic fuse component determines a voltage difference or voltage drop across the electrodes of the transistor and provides an output voltage based on this voltage difference. In at least one embodiment, the gain of the differential circuit is configured so that the voltage of the output voltage is substantially equal to the voltage at the voltage supply input of the DUT when a defined maximum current threshold has been reached. A comparator circuit of the electronic fuse component compares the output voltage of the differential circuit with the voltage at the voltage supply input of the DUT and provides an output voltage based on this comparison. Switch circuitry of the electronic fuse component enables or disables the transistor based on the output voltage of the comparator circuit, thereby enabling or disabling current flow to the DUT based on whether the estimated current supplied to the DUT is under or over the defined maximum current threshold. Particular implementations of the electronic fuse component provide for relatively short current shut off times in response to an overcurrent condition and reduce or eliminate the need for an operator to manually inspect each test socket for fuse purposes.

Although the exemplary techniques are described herein in the context of overcurrent protection in a test board for ease of illustration, it will be appreciated that the disclosed techniques may be implemented for overcurrent protection in any kind of electronic device in any manner without departing from the scope of the present disclosure. To illustrate, the electronic fuse components disclosed herein can be embedded at the voltage supply input of an integrated circuit device to provide overcurrent protection at the integrated circuit device.

Referring to FIG. 1, an exemplary test board system 100 is illustrated in accordance with at least one embodiment of the present disclosure. The test board system 100 includes a power supply 102 to provide a test voltage (voltage $V_T$), a power supply to provide an operational voltage (voltage $V_{CC}$), and a test board 106. The test board 106 includes a plurality of test sockets, such as test sockets 112, 114, 116 and 118 (test sockets 112-118), each test socket to receive a corresponding device under test (DUT), such as DUTs 122, 124, 126 and 128 (DUTs 122-128). The test board 106 further includes a plurality of electronic fuse components, such as electronic fuse components 132, 134, 136 and 138 (electronic fuse components 132-138), each one associated with a corresponding one of the plurality of test sockets. The test board 106 also includes a control module 130 having an output to provide an enable (EN) signal used to enable and disable the operation of the electronic fuse components 132-138. The test board 106 additionally includes a plurality of leads, including a ground (GND) voltage lead 140 and a $V_T$ voltage lead 142 connected to the power supply 102, a $V_{CC}$ voltage lead 144 connected to the power supply 104, and an enable lead 146 connected to an output of the control module 130.

Each of the electronic fuse components 132-138 includes a first input connected to the GND lead 140, a second input connected to the $V_T$ voltage lead 142, a third input connected to the $V_{CC}$ voltage lead 144, and a fourth input connected to the enable lead 146. Each of the electronic fuse components 132-138 further includes an output to provide a test voltage to a voltage supply input of the corresponding DUT during normal operation, where the provided test voltage is based on the $V_T$ voltage. To illustrate, the electronic fuse component 132 provides a test voltage $V_{T1}$ to the voltage supply input 152 of the DUT 122, the electronic fuse component 134 provides a test voltage $V_{T2}$ to the voltage supply input 154 of the DUT 124, the electronic fuse component 136 provides a test voltage $V_{T3}$ to the voltage supply input 156 of the DUT 126, and the electronic fuse component 138 provides a test voltage $V_{T4}$ to the voltage supply input 158 of the DUT 128.

As described in greater detail with reference to FIGS. 2-7, the electronic fuse components 132-138 utilize the voltage drop across a transistor in series connection between the $V_T$ voltage lead 142 and the voltage supply input of the corresponding DUT to determine a voltage representative of an estimated current supplied to the DUT. Switch circuitry of the electronic fuse component is configured to enable or disable the transistor in response to the estimated current supplied to the DUT being less than or greater than a predetermined maximum current threshold, respectively. Disabling the transistor reduces or eliminates current flow to the DUT, thereby protecting both the DUT and the test socket from damage.

Figure 2:
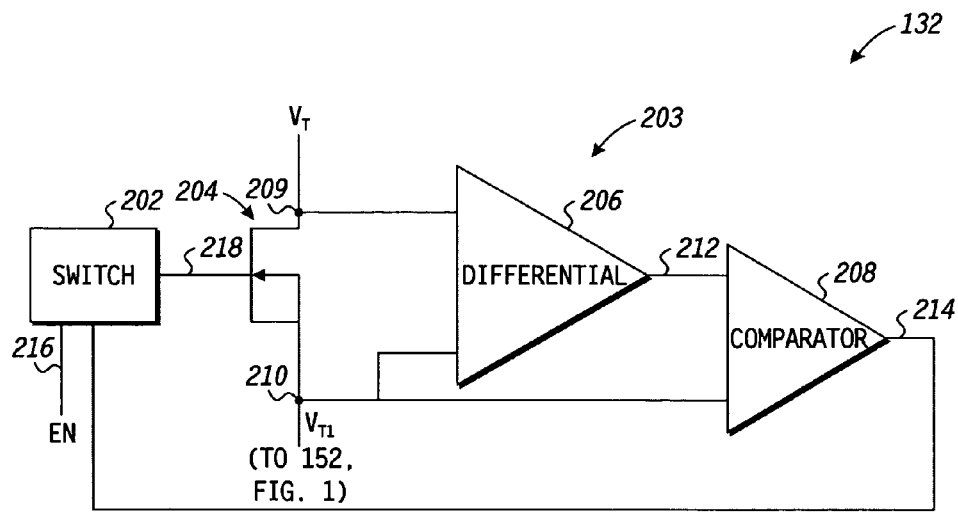
FIG. 2 is a block diagram illustrating an exemplary electronic fuse component of the test board of FIG. 1 in accordance with at least one embodiment of the present disclosure.

Referring to FIG. 2, an exemplary implementation of the electronic fuse component 132 of the test board system 100 of FIG. 1 is illustrated in accordance with at least one embodiment of the present disclosure. The other electronic fuse components of the test board system 100 can be implemented in a similar manner.

In the depicted example, the electronic fuse component 132 includes switch circuitry 202 and current detection circuitry 203. The current detection circuitry 203 includes a transistor 204, a differential circuit 206 and a comparator circuit 208. The transistor 204 includes a first current-carrying electrode (e.g., the drain electrode) connected to a node 209, which in turn is connected to the $V_T$ voltage reference of the power supply 102 (FIG. 1) via, e.g., the $V_T$ voltage lead 140 (FIG. 1). The transistor 204 further includes a second current-carrying electrode (e.g., the source electrode) connected to a node 210, which in turn is connected to the voltage supply input 152 of the DUT 122 (FIG. 1). The transistor 204 also includes a control electrode (e.g., the gate electrode) connected to an output of the switch circuitry 202. The transistor 204, in one embodiment, is implemented as an n-type field effect transistor (FET), such as a metal oxide FET (MOSFET) transistor.

The differential circuit 206 includes a first signal input connected to the node 209 and a second signal input connected to the node 210, and an output to provide an output voltage 212 based on the voltage drop between the node 209 and the node 210. The output voltage 212 further is based on a gain of the differential circuit 206. The comparator circuit 208 includes a first signal input connected to the output of the differential circuit 206, a second signal input connected to the node 210, and an output to provide an output voltage 214 based on a comparison of the output voltage 212 with the voltage $V_{T1}$ at the node 210.

The switch circuitry 202 includes a first input to receive an EN signal 216 provided by the control module 130 (FIG. 1) and a second input connected to the output of the comparator circuit 208. The switch circuitry 202 further includes an output to provide a control signal 218 to the control gate of the transistor 204, where the state of the control signal 218 (e.g., asserted or unasserted) is based on the EN signal 216 and the output voltage 214.

The electronic fuse component 132 is initialized by asserting the EN signal 216. In response, the switch circuitry 202 forces the transistor 204 on by asserting the control signal 218, thereby initializing the electronic fuse component 132 to a known state. At this point, the power supply 102 can be powered on to supply the voltage $V_T$ to DUT 122 via the electronic fuse component 132. After the voltage $V_T$ becomes available to the electronic fuse component 132, the switch circuitry 202 can deassert the EN signal 216.

During the monitoring process, the differential circuit 206 provides the output voltage 212, which is substantially proportional to the voltage difference between the nodes 209 and 210. In at least one embodiment, the approximate resistance of the transistor 204 is known, so the current being supplied to the voltage supply input 152 via the transistor is based on the relationship:

$$I_{TR} = \frac{V_{TR}}{R_{TR}} \qquad \text{(EQ. 1)}$$

where $I_{TR}$ represents the current supplied via the transistor 204, $V_{TR}$ represents the voltage drop across the transistor 204 (i.e., the difference between the voltages at nodes 209 and 210), and $R_{TR}$ represents the resistance of the transistor 204.

Accordingly, in at least one embodiment, the gain of the differential circuit 206 is configured so that the output voltage 212 is approximately equal to the voltage $V_{T1}$ supplied to the voltage supply input 152 of the DUT 122 when the current $I_{TR}$ is approximately equal to the defined maximum current threshold. Thus, when the current $I_{TR}$ is below the maximum current threshold, the output voltage 212 is less than the voltage $V_{T1}$ and when the current $I_{TR}$ is at or above the maximum current threshold, the output voltage 212 is equal to or greater than the voltage $V_{T1}$.

Also during the monitoring process, the comparator circuit 208 provides the output voltage 214 based on the difference between the output voltage 212 and the voltage $V_{T1}$ at the voltage supply input 152. When the output voltage 212 is less than the voltage $V_{T1}$ (i.e., the current $I_{TR}$ is less than the maximum current threshold), the comparator circuit 208 provides a low voltage (e.g., approximately zero volts) for the output voltage 214. In response, the switch circuitry 202 continues to bias the transistor 204 via the control signal 218 so that current flow is uninterrupted. Conversely, when the output voltage 212 is at or greater than the voltage $V_{T1}$ (i.e., the current $I_{TR}$ is at or greater than the maximum current threshold), the comparator circuit 208 provides a high voltage for the output voltage 214. In response, the switch circuitry 202 stops biasing the transistor 204 via the control signal 218, thereby disabling the transistor 204 and, consequently, terminating the flow of current to the voltage supply input 152 of the DUT 122. As a result, the DUT 122 and the test socket 112 are protected from damage due to overheating caused by overcurrent to the DUT 122.

Figure 3:
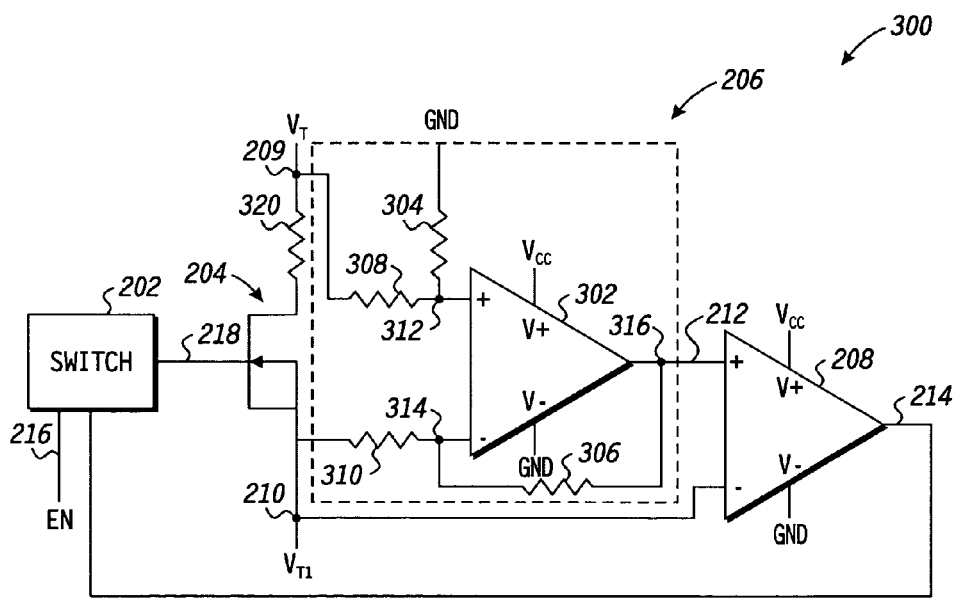
FIG. 3 is a circuit diagram illustrating an exemplary implementation of the electronic fuse component of FIG. 2 in accordance with at least one embodiment of the present disclosure.

Referring to FIG. 3, an exemplary implementation of an electronic fuse component 300 is illustrated in accordance with at least one embodiment of the present disclosure. The electronic fuse component 300 includes the switch circuitry 202, the transistor 204, the differential circuit 206 and the comparator circuit 208 as described above with reference to FIG. 2.

In the depicted example, the differential circuit 206 includes an operational amplifier (op-amp) 302 and resistors 304, 306, 308 and 310. The op-amp 302 includes a positive voltage supply input connected to the voltage $V_{CC}$ via, e.g., the $V_{CC}$ voltage lead 144 (FIG. 1) and a negative voltage supply input connected to GND via, e.g., the GND voltage lead 140 (FIG. 1). The op-amp 302 further includes a positive signal input connected to a node 312, a negative signal input connected to a node 314, and an output connected to a node 316, where the node 316 provides the output voltage 212. The resistor 304 includes an electrode connected to the GND voltage and an electrode connected to the node 312. The resistor 306 includes an electrode connected to the node 314 and an electrode connected to the node 316. The resistor 308 includes an electrode connected to the node 312 and an electrode connected to the node 209. The resistor 310 includes an electrode connected to the node 314 and an electrode connected to the node 210.

The comparator circuit 208, in the illustrated example, is implemented as an op-amp 214 having a positive voltage supply input connected to the voltage $V_{CC}$, a negative voltage supply input connected to the GND voltage, a positive signal input connected to the node 316 and a negative signal input connected to the node 210. The op-amp 214 further includes an output to provide the output voltage 214.

As noted above, the current $I_{TR}$ provided to the voltage supply input 152 is determined based on the voltage drop between the nodes 209 and 210. However, in certain implementations, the resistance of the transistor 204 can be low enough so as to make it difficult to accurately determine the voltage drop between the nodes 209 and 210. Accordingly, in at least one embodiment, a resistor 320 can be connected in series with the transistor 204 between the node 209 and the node 210, thereby increasing the total resistance between the nodes 209 and 210 for more accurate voltage drop detection.

As also noted above, the gain of the differential circuit 206 can be configured so that the output voltage 212 supplied by the differential circuit 206 is substantially equal to the voltage $V_{T1}$ the when the current $I_{TR}$ is substantially equal to a defined maximum current threshold. The gain of the differential circuit 206 can be represented as:

$$G = \frac{V_{T1}}{I_{max} * R_{tot}} \qquad \text{(EQ. 2)}$$

where G represents the gain of the differential circuit, $I_{max}$ represents the maximum current threshold, and $R_{tot}$ represents the total resistance between the node 209 and the node 210 (e.g., the total resistance of the resistor 320 and the transistor 204 in series). Further, it will be appreciated that for the exemplary implementation of FIG. 3, the gain G of the differential circuit also may be represented as:

$$G = 1 + \frac{R_{306}}{R_{308}} \qquad \text{(EQ. 3)}$$

where $R_{306}$ represents the resistance of the resistor 306 and $R_{308}$ represents the resistance of the resistor 308. Equation 4 below results from the combination of equations 2 and 3:

$$\frac{V_{T1}}{I_{max} * R_{tot}} = 1 + \frac{R_{306}}{R_{308}} \qquad \text{(EQ. 4)}$$

Given a known voltage $V_{T1}$ and a known maximum current threshold ($I_{max}$), the transistor 204 and the resistors 306, 308 and 320 may be selected in view of equation 4 to provide the desired gain G for the differential circuit 206.

Figure 4:
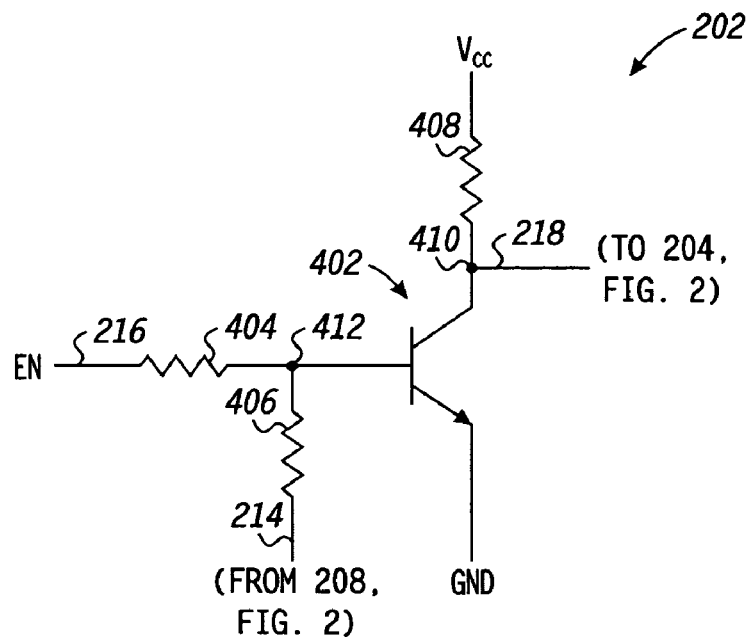
FIG. 4 is a circuit diagram illustrating an exemplary implementation of switch circuitry of the electronic fuse component of FIG. 2 in accordance with at least one embodiment of the present disclosure.

Referring to FIG. 4, an exemplary implementation of the switch circuitry 202 is illustrated in accordance with at least one embodiment of the present disclosure. The switch circuitry 202 includes a transistor 402 (e.g., a bipolar transistor) and resistors 404, 406 and 408. The transistor 402 includes a first current-carrying electrode (e.g., a collector electrode) connected to a node 410, which is connected to the control electrode of the transistor 204 (FIG. 2) to provide the control signal 218. The transistor 402 further includes a second current-carrying electrode (e.g., a emitter electrode) connected to the GND voltage, and a control electrode (e.g., a base electrode) connected to a node 412. The resistor 404 includes an electrode connected to receive the EN signal 216 and an electrode connected to the node 412. The resistor 406 includes an electrode connected to the node 412 and an electrode connected to receive the output voltage 214 from the comparator circuit 208 (FIG. 2). The resistor 408 includes an electrode connected to the $V_{CC}$ voltage and an electrode connected to the node 410.

After initialization, the transistor 402 remains disabled unless either of the EN signal 216 or the output voltage 214 goes to a high voltage, which results in a high voltage at the node 412. In response to a high voltage at the node 412, the transistor 402 is enabled, thereby pulling the node 410 to the GND voltage, which results in a low voltage for the control signal 218. As described above, when the control signal 218 has a low voltage, the transistor 204 is disabled, thereby terminating current flow to the voltage supply input of the DUT. Once disabled, the transistor 402 remains disabled until the EN signal 216 is deasserted.

Figure 5:
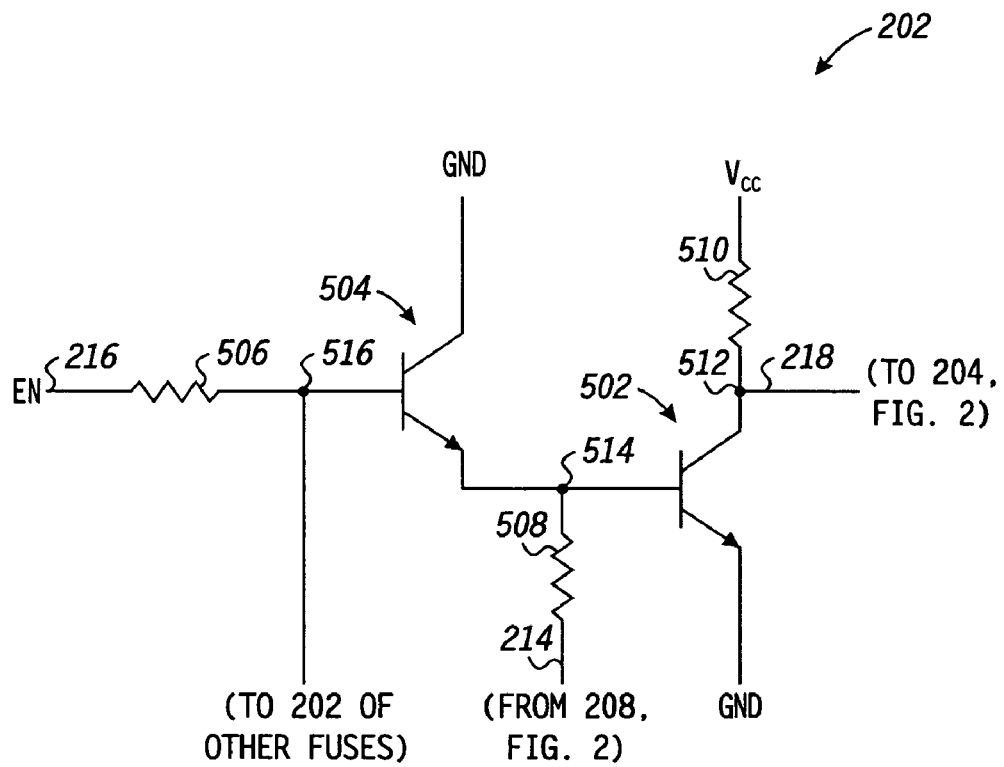
FIG. 5 is a circuit diagram illustrating another exemplary implementation of switch circuitry of the electronic fuse component of FIG. 2 in accordance with at least one embodiment of the present disclosure.

Referring to FIG. 5, an alternate implementation of the switch circuitry 202 is illustrated in accordance with at least one embodiment of the present disclosure. The switch circuitry 202 includes transistors 502 and 504 and resistors 506, 508 and 510. The transistor 502 includes a first current-carrying electrode connected to the GND voltage, a second current-carrying electrode connected to a node 512, and a control electrode connected to a node 514. The node 512, in turn, is connected to the control electrode of the transistor 204 (FIG. 2) and the voltage at the node 512 is provided as the control signal 218. The transistor 504 includes a first current-carrying electrode connected to the node 514, a second current-carrying electrode connected to the GND voltage, and a control electrode connected to a node 516. The resistor 506 includes an electrode to receive the EN signal 216 and an electrode connected to the node 516. The resistor 508 includes an electrode to receive the output voltage 214 from the comparator circuit 208 (FIG. 2) and an electrode connected to the node 514. The resistor 510 includes an electrode connected to the $V_{CC}$ voltage and an electrode connected to the node 512.

In at least one embodiment, the same EN signal 216 can be used to control multiple electronic fuse components implemented at a test board. Accordingly, the node 516 of the switch circuitry 202 of one electronic fuse component can be connected to the corresponding node 516 of the switch circuitry 202 of one or more other electronic fuse components so as to allow the EN signal 216 to enable and disable multiple electronic fuse components in parallel.

In the depicted example, the electronic fuse component is initialized by asserting the EN signal 216, which enables the transistor 504, thereby pulling the node 514 to the GND voltage. As a result, the node 514 is pulled to the $V_{CC}$ voltage, which in turn enables the transistor 204, thereby causing the transistor 204 to permit current flow to the DUT. During monitoring operations, the node 512 remains at the $V_{CC}$ voltage, and therefore the transistor 204 remains enabled, unless the comparator circuit 208 asserts a high voltage for the output voltage 214 (e.g., in response to the current $I_{TR}$ being at or above the maximum current threshold). In response to the high voltage, the node 514 is pulled to a high voltage, which in turn enables the transistor 502, causing the node 512 to be pulled to the GND voltage. As a result of the node 512 having the GND voltage, the transistor 204 is disabled, thereby interrupting current flow through the transistor 204 to the DUT.

Figure 6:
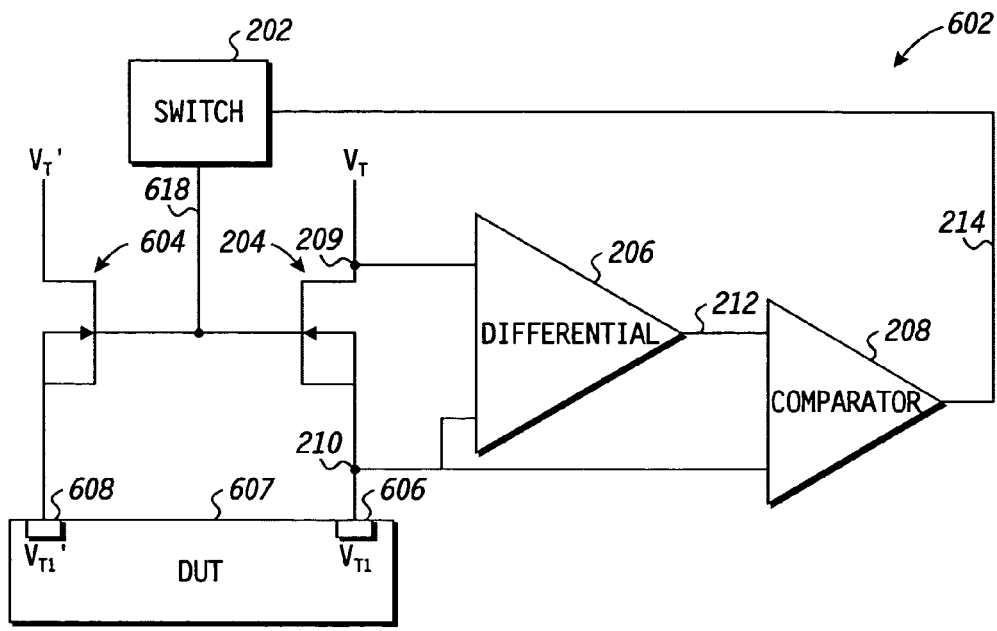
FIG. 6 is a block diagram illustrating an exemplary electronic fuse component in accordance with at least one embodiment of the present disclosure.

Referring to FIG. 6, another exemplary implementation of an electronic fuse component 602 is illustrated in accordance with at least one embodiment of the present disclosure. In the illustrated embodiment, two test voltages, $V_T$ and $V_{T'}$, are supplied to voltage supply inputs 606 and 608, respectively, of a DUT 609 via the electronic fuse component 602. As with the electronic fuse component 132 of FIG. 2, the electronic fuse component 602 includes the switch circuitry 202, the transistor 204, the differential circuit 206, and the comparator circuit 208. The electronic fuse component 602 further includes a transistor 604 having a current-carrying electrode connected to the $V_{T'}$ voltage, a second current-carrying electrode connected to the voltage supply input 608, and a control electrode connected to the control electrode of the transistor 204.

The differential circuit 206 provides an output voltage 212 that is substantially proportional to the voltage drop between node 209 and 210 (which is substantially proportional to the current $I_{TR}$) and the comparator circuit 208 provides an output voltage 214 based on a comparison of the output voltage 212 with the voltage at the node 210. As with FIG. 2, the switch circuit 202 provides a control signal 618 to enable or disable current flow to the voltage supply input 606 by enabling or disabling the transistor 204 based on the output voltage 214. Moreover, in at least one embodiment, the control signal 618 can be used to enable or disable current flow to the voltage supply input 606 by enabling or disabling the transistor 604. Thus, the monitoring of the current flow characteristics of one voltage supply input of the DUT can be used to disable current flow to other voltage supply inputs of the DUT.

Figure 7:
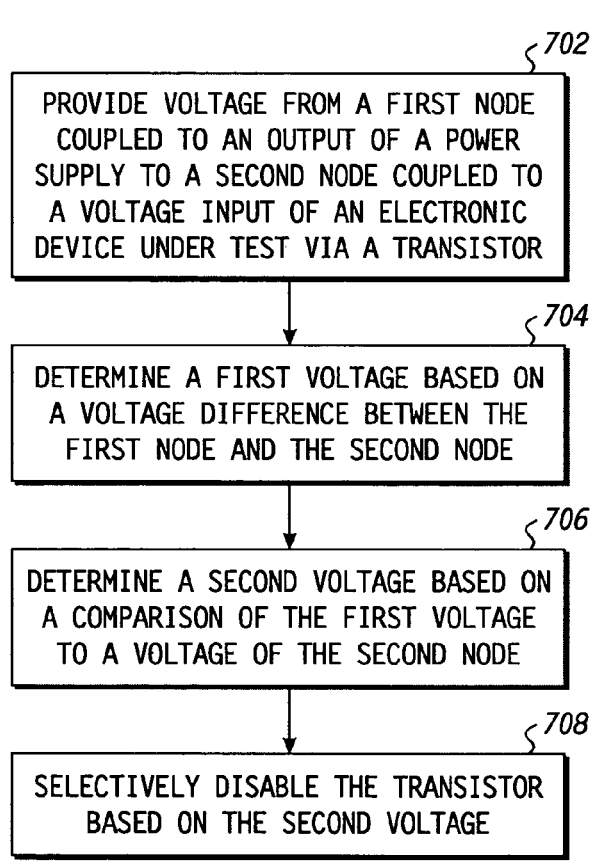
FIG. 7 is a flow diagram illustrating an exemplary overcurrent protection method in accordance with at least one embodiment of the present disclosure.

Referring to FIG. 7, an exemplary method 700 for providing overcurrent protection to a DUT is illustrated in accordance with at least one embodiment of the present disclosure. The method 700 includes providing a voltage from a first node connected to an output of a power supply to a second node connected to a voltage supply input of the DUT via a transistor at block 702. At block 704, the method 700 includes determining a first voltage based on a voltage difference between the first node and the second node. In at least one embodiment, the first voltage is representative of a current through the transistor. At block 706, the method 700 includes determining a second voltage based on a comparison of the first voltage to a voltage of the second node.

At block 708, the method 700 includes selectively disabling the transistor based on the second voltage. In one embodiment, the second voltage indicates whether the current through the transistor is greater than or less than a maximum current threshold. Accordingly, the transistor is disabled when the second voltage indicates that the current through the transistor is greater than the maximum current threshold and the transistor remains enabled when the second voltage indicates that the current through the transistor is less than the maximum current threshold.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. An electronic component comprising:
   a first transistor having a first current-carrying electrode coupled to a first node, a second current-carrying electrode coupled to a second node, and a control electrode, wherein the first node is coupled to a voltage output of a power supply and the second node is coupled to a voltage supply input of an electronic device;

a differential circuit having a first input coupled to the first node, a second input coupled to the second node, and an output to provide a first voltage based on a voltage difference between the first node and the second node, the differential circuit comprising:

a first operational amplifier having a first signal input, a second signal input, a first voltage supply input coupled to a first voltage reference, a second voltage supply input coupled to a second voltage reference, and an output;

a first resistive element having a first electrode coupled to the first node and a second electrode coupled to the first signal input of the first operational amplifier; and a second resistive element having a first electrode coupled to the second signal input of the first operational amplifier and a second electrode couple to the output of the first operational amplifier;

a comparator circuit having a first input coupled to the output of the differential circuit, a second input coupled to the second node, and an output to provide a second voltage based on a comparison of a voltage at the second node and the first voltage, the comparator comprising a second operational amplifier having a first signal input coupled to the output of the first operational amplifier, a second signal input coupled to the second node, a first voltage supply input coupled to the first voltage reference, a second voltage supply input coupled to the second voltage reference, and an output coupled to the first input of the switch circuit; and switch circuitry having a first input coupled to the output of the comparator circuit, a second input to receive an enable signal, and an output coupled to the control electrode of the first transistor, the output to provide a third voltage responsive to the second voltage and responsive to the enable signal, the switch circuitry comprising:

a second transistor having a first current-carrying electrode coupled to the first voltage reference and coupled to the control electrode of the first transistor, a second current-carrying electrode coupled to the second voltage reference, and a control electrode;

a third resistive element having a first electrode coupled to the output of the second operational amplifier and a second electrode coupled to the control electrode of the second transistor; and a third transistor having a first current-carrying electrode coupled to the second voltage reference, a second current-carrying electrode coupled to the control electrode of the second transistor, and a control electrode to receive the enable signal.

2. The electronic component of claim 1, wherein a gain of the differential circuit is configured based on a resistance of the first transistor.

3. The electronic component of claim 1, wherein the first transistor comprises a field effect transistor.

4. The electronic component of claim 1, wherein the switch circuitry is configured to provide the third voltage when the second voltage indicates that the first voltage is less than the voltage at the second node, and wherein the first transistor is enabled responsive to receiving the third voltage at the control electrode.

5. The electronic component of claim 4, wherein the switch circuitry is configured to provide a fourth voltage, less than the third voltage, when the second voltage indicates that the first voltage is less than the voltage at the second node, and wherein the first transistor is disabled responsive to receiving the fourth voltage at the control electrode.

6. The electronic component of claim 1, wherein the electronic device comprises an electronic device under test.

7. The electronic component of claim 1, wherein:
the electronic component comprises a first electronic component; and
the control electrode of the third transistor is coupled to switch circuitry of a second electronic component.

8. A system comprising:
a first power supply having an output to provide a first voltage;
a second power supply having an output to provide a second voltage;
a test board having a socket to receive a corresponding electronic device; and
a fuse component comprising:
a first transistor having a first current-carrying electrode coupled to the output of the first power supply, a second current-carrying electrode coupled to a voltage supply input of the corresponding electronic device, and a control electrode;
current detection circuitry to provide a third voltage based on a voltage difference between the first current-carrying electrode and the second current-carrying electrode; and
switch circuitry comprising:
a first input to receive an enable signal, a second input coupled to the output of the current detection circuitry, and an output coupled to the control electrode of the first transistor;
a second transistor having a first current-carrying electrode coupled to a first voltage reference and the control electrode of the first transistor, a second current-carrying electrode coupled to a second voltage reference, and a control electrode;
a resistive element having a first electrode coupled to an output of the current detection circuitry and a second electrode coupled to the control electrode of the second transistor; and
a third transistor having a first current-carrying electrode coupled to the second voltage reference, a second current-carrying electrode coupled to the control electrode of the second transistor, and a control electrode coupled to receive the enable signal, wherein the switch circuitry is configured to selectively disable current flow between the first current-carrying electrode and the second current-carrying electrode of the first transistor via the control electrode in response to at least one of the third voltage or the enable signal.

9. The system of claim 8, wherein the switch circuitry is configured to provide a first value at the output responsive to at least one of the third voltage or the enable signal having an asserted value and provides a second value at the output responsive to both of the third voltage and the enable signal having unasserted values, wherein the first transistor is configured to enable current flow between the first current-carrying electrode and the second current-carrying electrode in response to the first value and to disable current flow between the first current-carrying electrode and the second current-carrying electrode in response to the second value.

10. The system of claim 8, wherein the current detection circuitry comprises:
a first operational amplifier having a first signal input, a second signal input, a first voltage supply input coupled to the first voltage reference of the output of the second power supply, a second voltage supply input coupled to the second voltage reference of the output of the second power supply, and an output; and a second operational amplifier having a first signal input coupled to the output of the first operational amplifier, a second signal input coupled to voltage input of the corresponding electronic device, a first voltage supply input coupled to the first voltage reference, a second voltage supply input coupled to the second voltage reference, and an output coupled to the second input of the switch circuit.

11. The system of claim 8, wherein the electronic device comprises a device under test.

12. The system of claim 8, wherein:
the electronic device comprises a first electronic device;
the fuse component comprises a first fuse component; and
the test board has a socket to receive a second electronic device; and
the system further comprises:
a second fuse component comprising:
a fourth transistor having a first current-carrying electrode coupled to the output of the first power supply, a second current-carrying electrode coupled to a voltage supply input of the second electronic device, and a control electrode;
current detection circuitry to provide a fourth voltage based on a voltage difference between the first current-carrying electrode of the fourth transistor and the second current-carrying electrode of the fourth transistor; and
switch circuitry comprising:
a first input to receive the enable signal, a second input coupled to the output of the current detection circuitry, and an output coupled to the control electrode of the fourth transistor;
a fifth transistor having a first current-carrying electrode coupled to the first voltage reference and the control electrode of the fourth transistor, a second current-carrying electrode coupled to the second voltage reference, and a control electrode;
a resistive element having a first electrode coupled to an output of the current detection circuitry and a second electrode coupled to the control electrode of the fifth transistor; and
a sixth transistor having a first current-carrying electrode coupled to the second voltage reference, a second current-carrying electrode coupled to the control electrode of the sixth transistor, and a control electrode coupled to receive the enable signal, wherein the switch circuitry is configured to selectively disable current flow between the first current-carrying electrode and the second current-carrying electrode of the fifth transistor via the control electrode in response to at least one of the fourth voltage or the enable signal.

13. A method comprising:
providing test system comprising:
a first power supply having an output to provide a first voltage;
a second power supply having an output to provide a second voltage;
a test board having a socket to receive a corresponding electronic device; and
a fuse component comprising:
a first transistor having a first current-carrying electrode coupled to the output of the first power supply, a second current-carrying electrode coupled to a voltage supply input of the corresponding electronic device, and a control electrode;
current detection circuitry to provide a third voltage based on a voltage difference between the first current-carrying electrode and the second current-carrying electrode; and
switch circuitry comprising:
a first input to receive an enable signal, a second input coupled to the output of the current detection circuitry, and an output coupled to the control electrode of the first transistor;
a second transistor having a first current-carrying electrode coupled to a first voltage reference and the control electrode of the first transistor, a second current-carrying electrode coupled to a second voltage reference and a control electrode;
a resistive element having a first electrode coupled to an output of the current detection circuitry and a second electrode coupled to the control electrode of the second transistor; and
a third transistor having a first current-carrying electrode coupled to the second voltage reference, a second current-carrying electrode coupled to the control electrode of the second transistor, and a control electrode coupled to receive the enable signal, wherein the switch circuitry is configured to selectively disable current flow between the first current-carrying electrode and the second current-carrying electrode of the first transistor via the control electrode in response to at least one of the third voltage or the enable signal; and
performing a burn-in test of the electronic device by supplying a current to the electronic device via the fuse component.

14. The method of claim 13, wherein performing the burn-in test comprises:
providing current from the first power supply to the voltage supply input of the corresponding electronic device via the first transistor;
determining, at the current detection circuit, the third voltage responsive to providing current; and
selectively disabling the first transistor based on the third voltage.

15. The method of claim 14, wherein determining the third voltage comprises:
determining a fourth voltage representing a voltage difference between the first current carrying electrode and the second current-carrying electrode of the first transistor; and
determining the third voltage based on a comparison of the fourth voltage to a fifth voltage, the fifth voltage is representative of a maximum current threshold of the electronic device.

16. The method of claim 15, wherein determining the fourth voltage comprises determining the fourth voltage using a differential circuit.

17. The method of claim 15, wherein determining the third voltage comprises determining the third voltage using a comparator circuit.

* * * * *

UNITED STATES PATENT AND TRADEMARK OFFICE
CERTIFICATE OF CORRECTION

| | | |
|---|---|---|
| PATENT NO. | : 7,498,864 B2 | Page 1 of 1 |
| APPLICATION NO. | : 11/397747 | |
| DATED | : March 3, 2009 | |
| INVENTOR(S) | : Douglas R. Grover | |

It is certified that error appears in the above-identified patent and that said Letters Patent is hereby corrected as shown below:

In the Claims,

Column 9, Line 20, Claim 1 please change "electrode couple to" to --electrode coupled to--

Column 9, Line 33, Claim 1 please change "switch circuit" to --switch circuitry--

Signed and Sealed this
Eighteenth Day of January, 2011

David J. Kappos
*Director of the United States Patent and Trademark Office*